(12) United States Patent
Gongwer et al.

(10) Patent No.: US 6,434,044 B1
(45) Date of Patent: Aug. 13, 2002

(54) METHOD AND SYSTEM FOR GENERATION AND DISTRIBUTION OF SUPPLY VOLTAGES IN MEMORY SYSTEMS

(75) Inventors: Geoffrey Steven Gongwer, Los Altos; Kevin M. Conley, San Jose; Chi-Ming Wang, Fremont; Yong Liang Wang, Saratoga; Raul Adrian Cernea, Santa Clara, all of CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 09/788,120

(22) Filed: Feb. 16, 2001

(51) Int. Cl.[7] ............................................... G11C 16/04
(52) U.S. Cl. ............................ 365/185.18; 365/185.11; 365/226
(58) Field of Search ....................... 365/185.18, 185.11, 365/226

(56) References Cited

U.S. PATENT DOCUMENTS

| | | |
|---|---|---|
| 4,433,282 A | 2/1984 | Squires |
| 4,578,772 A | 3/1986 | Fujii |
| 5,305,275 A | 4/1994 | Yamashita et al. |
| 5,306,961 A | 4/1994 | Leo |
| 5,511,026 A | 4/1996 | Cleveland et al. |
| 5,524,231 A * | 6/1996 | Brown ........................ 395/428 |
| 5,553,261 A * | 9/1996 | Hasbun et al. ............... 395/430 |
| 5,596,532 A | 1/1997 | Cernea et al. |
| 5,598,370 A | 1/1997 | Niijima et al. |
| 5,621,685 A * | 4/1997 | Cernea et al. ......... 365/185.18 |
| 5,671,179 A | 9/1997 | Javanifard |
| 5,694,360 A | 12/1997 | Iizuka et al. |
| 5,818,781 A | 10/1998 | Estakhri et al. |

* cited by examiner

Primary Examiner—Huan Hoang
(74) Attorney, Agent, or Firm—Beyer Weaver & Thomas, LLP

(57) ABSTRACT

Techniques for producing and supplying various voltage levels within a memory system having multiple memory blocks (e.g., memory chips) are described. The various voltage levels can be produced by voltage generation circuitry (e.g., charge pump and/or regulator circuitry) within the memory system. The various voltage levels can be supplied to the multiple memory blocks through a power bus. According to one aspect, charge pump and/or regulator circuits are provided within at most one of the memory blocks of a memory system (unless back-ups are provided for fault tolerance), and a power bus is used to distribute the generated voltage levels to other of the memory blocks. According to another aspect, a memory controller generates multiple supply voltage levels that are distributed (e.g., via a power bus) to each of the memory blocks.

43 Claims, 5 Drawing Sheets

METHOD AND SYSTEM FOR GENERATION AND DISTRIBUTION OF SUPPLY VOLTAGES IN MEMORY SYSTEMS

CROSS REFERENCE TO RELATED APPLICATION

This application is related to U.S. patent application Ser. No. 09/785,915, entitled "METHOD AND SYSTEM FOR DISTRIBUTED POWER GENERATION IN MULTI-CHIP MEMORY SYSTEMS", and filed on Feb. 16, 2001, and which is hereby incorporated by reference herein.

BACKGROUND OF THE INVENTION

1. Field of the Invention

The invention relates to voltage generation and, more particularly, to voltage generation internal to memory systems.

2. Description of the Related Art

Memory cards are commonly used to store digital data for use with various products (e.g., electronics products). Examples of memory cards are flash cards that use Flash type or EEPROM type memory cells to store the data. Flash cards have a relatively small form factor and have been used to store digital data for products such as cameras, hand-held computers, set-top boxes, hand-held or other small audio players/recorders (e.g., MP3 devices), and medical monitors. A major supplier of flash cards is SanDisk Corporation of Sunnyvale, Calif.

FIG. 1 is a block diagram of a conventional memory system 100. The conventional memory system 100 provides non-volatile data storage and represents, for example, a memory card (e.g., flash card). The conventional memory system 100 couples to a host 102. The host 102 can, for example, be a personal computer or an electronic appliance. The memory system 100 includes a memory controller 104 and memory chips 106 and 108. The memory controller 104 includes a voltage regulator 110. A host Input/Output (I/O) bus couples the memory controller 104 to the host 102. The host 102 also supplies a supply voltage $V_{DD}$ to the memory controller 104. The voltage regulator 110 within the memory controller 104 receives the supply voltage $V_{DD}$ and regulates the supply voltage to produce a regulated supply voltage $V_{DDR}$. The regulated supply voltage $V_{DDR}$ is supplied to each of the memory chips 106 and 108. The regulated supply voltage $V_{DDR}$ is a fixed voltage level (typically within a tolerance) that is supplied to the memory chips 106 and 108. In this embodiment, the memory chips 106 and 108 require the supply voltage that is supplied to the memory chips 106 and 108 be at a particular voltage level. Since the memory system 100 couples to various different hosts, the supply voltage $V_{DD}$ can vary over different voltage ranges, for example, 1.8 volts, 3.3 volts or 5 volts. However, it is typical that current memory chips require that the voltage be 3.3 volts. The voltage regulator 110 ensures that the regulated supply voltage $V_{DDR}$ is set at a particular voltage level (e.g., 3.3 volts) regardless of the level of the supply voltage $V_{DD}$.

In any case, the memory chips 106 and 108 require for their operation various different supply voltage levels than the particular voltage level (i.e., $V_{DDR}$) received from the memory controller 104. Hence, the memory chips 106 and 108 include charge pump circuits 112 and 114, respectively. The charge pump circuits 112 and 114 receive the regulated supply voltage $V_{DDR}$ independently and internally generate additional supply voltage levels for internal use by their associated memory chip. In another embodiment, the memory chips can operate upon receiving different supply voltages when the memory controller provides no voltage regulation. However, in doing so, memory chip design is more complex and optimal performance is lost because memory chips must detect the input supply voltage level and then select a set of operating parameters that correspond to the detected level of the input supply voltage.

One problem with the conventional memory system 100 is that each of the memory chips are required to include charge pump circuitry. The charge pump circuitry not only consumes precious semiconductor die area of the memory chips but also causes substantial noise generation when producing the additional supply voltages. The noise generation can detrimentally affect the sensitive analog portions of the memory chips. Accordingly, the additional noise provided by the charge pump circuitry degrades operational performance of the memory chips.

Thus, there is a need for improved approaches to producing various different supply voltage levels for use by memory chips that provide non-volatile data storage.

SUMMARY OF THE INVENTION

Broadly speaking, the invention relates to techniques for producing and supplying various voltage levels within a memory system having multiple memory blocks (e.g., memory chips). The various voltage levels can be produced by voltage generation circuitry (e.g., charge pump and/or regulator circuitry) within the memory system. The various voltage levels can be supplied to or between memory blocks through a power bus.

The invention can be implemented in numerous ways, such as, a system, apparatus, device, and method. Several embodiments of the invention are discussed below.

As a memory system that receives an external supply voltage from a host, one embodiment of the invention includes at least: a plurality of memory blocks, each of the memory blocks including at least a plurality of data storage elements; and a memory controller operatively coupled to the memory blocks and operatively coupled to receive the external supply voltage when the memory system is operatively connected to the host, the memory controller including at least a voltage generation circuit operable to produce at least a first supply voltage for use by each of the memory blocks. The embodiment of the invention may optionally include a power bus coupled to each of the memory blocks for supplying at least the first supply voltage between the memory blocks.

As a memory system that receives an external supply voltage from a host, another embodiment of the invention includes at least: a plurality of memory blocks, each of the memory blocks including at least a plurality of data storage elements, at least one of the memory blocks further including at least a first voltage generation circuit operable to produce at least one memory-generated supply voltage; a memory controller operatively coupled to the memory blocks and operatively coupled to receive the external supply voltage when the memory system is operatively connected to the host, the memory controller including at least a second voltage generation circuit operable to produce at least one controller-generated supply voltage; and a power bus coupled to each of the memory blocks. The power bus supplies the at least one memory-generated supply voltage between the memory blocks.

As a memory system that receives an external supply voltage from a host, still another embodiment of the invention includes at least: a plurality of memory blocks, each of the memory blocks including at least a plurality of data storage elements, at least one of the memory blocks further including at least a first voltage generation circuit operable to produce at least one memory-generated supply voltage; a memory controller operatively coupled to access the memory blocks; and a power bus coupled to each of the memory blocks. The power bus supplies the at least one memory-generated supply voltage between the memory blocks.

As a data storage device that removably couples to a host unit, one embodiment of the invention includes at least a memory controller; a plurality of memory blocks operatively connected to the memory controller, each of the memory blocks including at least data storage elements; and a power bus operatively supplying different level supply voltages between each of the memory blocks, the different level supply voltages being centrally generated by the memory controller or one of the memory blocks.

As an electronic system, one embodiment of the invention includes at least a data acquisition device, and a data storage device removably coupled to the data acquisition unit. The data storage device stores data acquired by the data acquisition device. The data storage device includes at least: a memory controller; a plurality of memory blocks operatively connected to the memory controller, each of the memory blocks including at least data storage elements; and a power bus operatively supplying different level supply voltages between each of the memory blocks, the different level supply voltages being centrally generated by the memory controller or one of the memory blocks.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to techniques for producing and supplying various voltage levels within a memory system having multiple memory blocks (e.g., memory chips). The various voltage levels can be produced by voltage generation circuitry (e.g., charge pump and/or regulator circuitry) within the memory system. The various voltage levels can be supplied to or between multiple memory blocks through a power bus.

According to one aspect of the invention, charge pump and/or regulator circuits are provided within one of the memory blocks of a memory system (unless back-ups are provided for fault tolerance), and a power bus is used to distribute the generated voltage levels to other of the memory blocks. At most, with this aspect, only one of the memory blocks needs to include charge pump and/or regulator circuitry. Hence, the invention serves to limit the extent to which undesirable noise generated by charge pump and/or regulator circuitry interferes with operation of sensitive analog components of memory blocks of a memory system.

According to another aspect of the invention, a memory controller generates multiple supply voltage levels that are distributed (e.g., via a power bus) to each of the memory blocks. Here, with this aspect, the memory blocks need not include any charge pump or regulator circuitry as the memory controller can centrally produce all the needed supply voltages and distribute them to each of the memory blocks.

Embodiments of this aspect of the invention are discussed below with reference to FIGS. 2–5. However, those skilled in the art will readily appreciate that the detailed description given herein with respect to these figures is for explanatory purposes as the invention extends beyond these limited embodiments.

Figure 1:
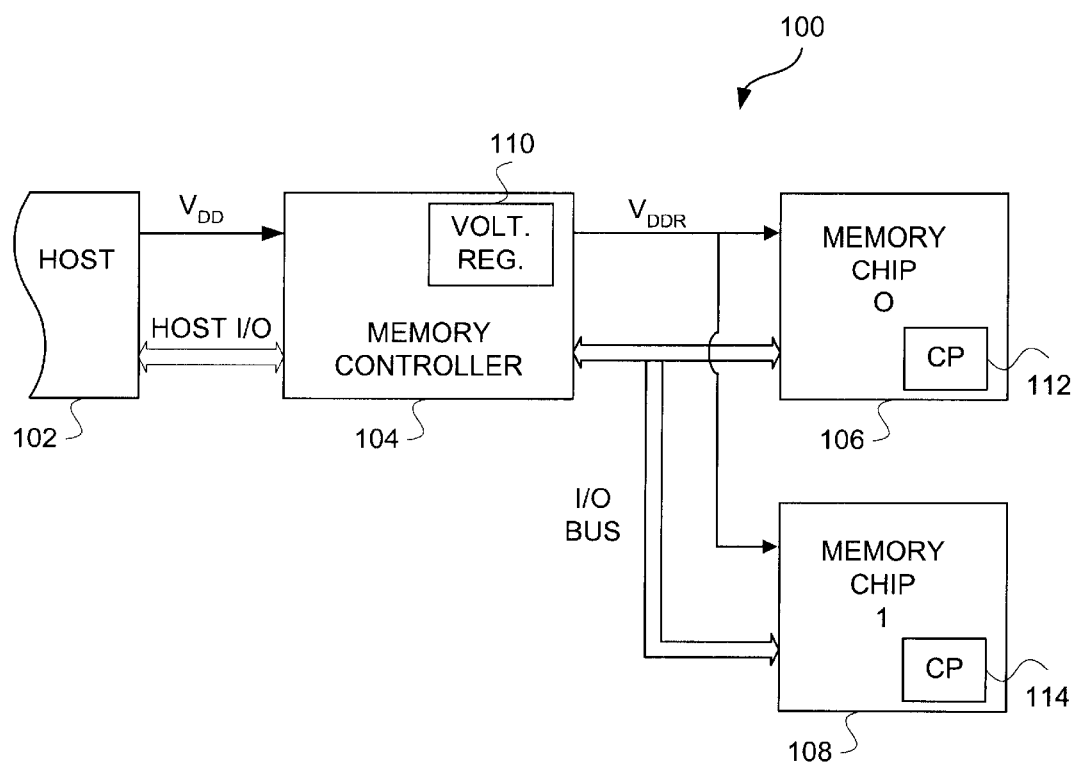
FIG. 1 is a block diagram of a conventional memory system.
Figure 2:
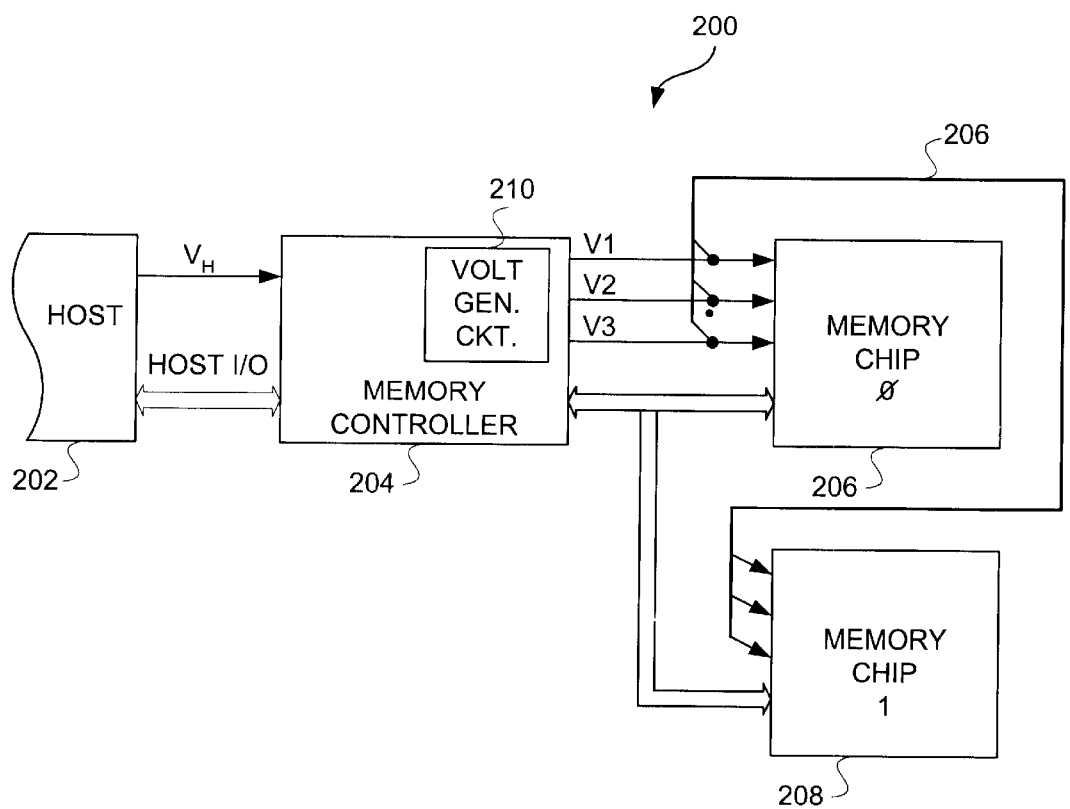
FIG. 2 is a block diagram of a memory system according to one embodiment of the invention.

FIG. 2 is a block diagram of a memory system 200 according to one embodiment of the invention. The memory system 200 is, for example, associated with a memory card (such as a plug-in card), a memory stick, or some other data storage product. Examples of a memory card include PC Card (formerly PCMCIA device), Flash Card, Flash Disk, Multimedia Card, and ATA Card.

The memory system 200 cooperates with a host 202. In particular, the memory system 200 stores data that is utilized by the host 202. The memory system 200 and the host 202 communicate over a host Input/Output (I/O) bus. The host 202 provides a host voltage $V_H$ (supply voltage) to the memory system 200.

The memory system 200 includes a memory controller 204 and memory blocks 206 and 208. In this embodiment, the memory system 200 includes two memory blocks. However, it should be noted that the memory system 200 can include two or more memory blocks. Typically, additional memory blocks are added to the memory system 200 to increase its data storage capacity.

The memory controller 204 includes a voltage generation circuit 210. The voltage generation circuit 210 receives the host voltage ($V_H$) supplied by the host 202 and generates a plurality of supply voltages that are supplied to the memory blocks 206 and 208. In this embodiment (and other embodiments below), the plurality of supply voltages are represented as supply voltages V1, V2 and V3. The supply voltages V1, V2 and V3 represent the voltage levels utilized by the memory blocks 206 and 208 during their operation. Accordingly, the memory blocks 206 and 208 do not further include charge pump or regulation circuitry as these memory blocks 206 and 208 do not internally generate any different supply voltages than those supply voltages V1, V2 and V3 received from the memory controller 204. Accordingly, the memory controller 204 generates all the needed supply voltages for the memory blocks 206 and 208 and thus charge pump regulation circuitry is not needed within the memory blocks 206 and 208. As result, noise generated by charge pump circuitry does not interfere with the operation (in particular, operation of sensitive analog components) of the memory blocks 206 and 208. Furthermore, costly die area of the semiconductor dies associated with the memory blocks 206 and 208 need not be consumed by charge pump regulator circuitry.

Moreover, the supply voltages V1, V2 and V3 produced by the memory controller 204 are supplied to the memory block 206. A power bus 212 operates to supply the supply voltages V1, V2 and V3 between the memory block 206 and the memory block 208. In other words, the power bus 212 carries the supply voltages V1, V2 and V3 to the memory block 208. Further, if the memory system 200 included additional memory blocks, the power bus 212 would also supply the supply voltages V1, V2 and V3 to the other additional memory blocks. The power bus 212 can also be considered as supplying the supply voltages V1, V2 and V3 to the memory block 206.

Typically, the memory controller 204 has output contacts (e.g., pins, pads, terminals, etc.) to output the supply voltages V1, V2 and V3. The memory blocks 206 and 208 have input contacts to receive the supply voltages V1, V2 and V3. In one implementation, links (e.g., wires, traces, etc.) are used to couple the output contacts of the memory controller 204 to the input contacts of the memory block 206 as well as to links of the power bus 212. In another embodiment, links of the power bus 212 are used to couple the output contacts of the memory controller 204 to the input contacts of both the memory blocks 206 and 208.

The level of the supply voltages can vary with implementation. As one example, the host voltage ($V_H$) might be 3.3 or 1.8 volts, and the level of the supply voltages V1, V2 and V3 can be 2.5 volts, 6.5 volts, and 3.3 volts. Although the embodiment of the memory system 200 shown in FIG. 2 produces supply voltages V1, V2 and V3 at the memory controller 204, it should be understood that the memory controller 204 can produce any number of a plurality of different supply voltage levels that would be needed by one or more of the memory blocks of the memory system 200.

Each of the memory blocks 206 and 208 include an array of data storage elements that provide non-volatile digital data storage. In one embodiment, the data storage elements are electrically programmable and electrically erasable. For example, the data storage elements can be based on floating-gate devices. The memory blocks 206 and 208 are each separate semiconductor dies, chips or products. The memory blocks can, for example, be EEPROM or FLASH devices. The memory controller 204 is also often a separate semiconductor die, chip or product.

Figure 3:
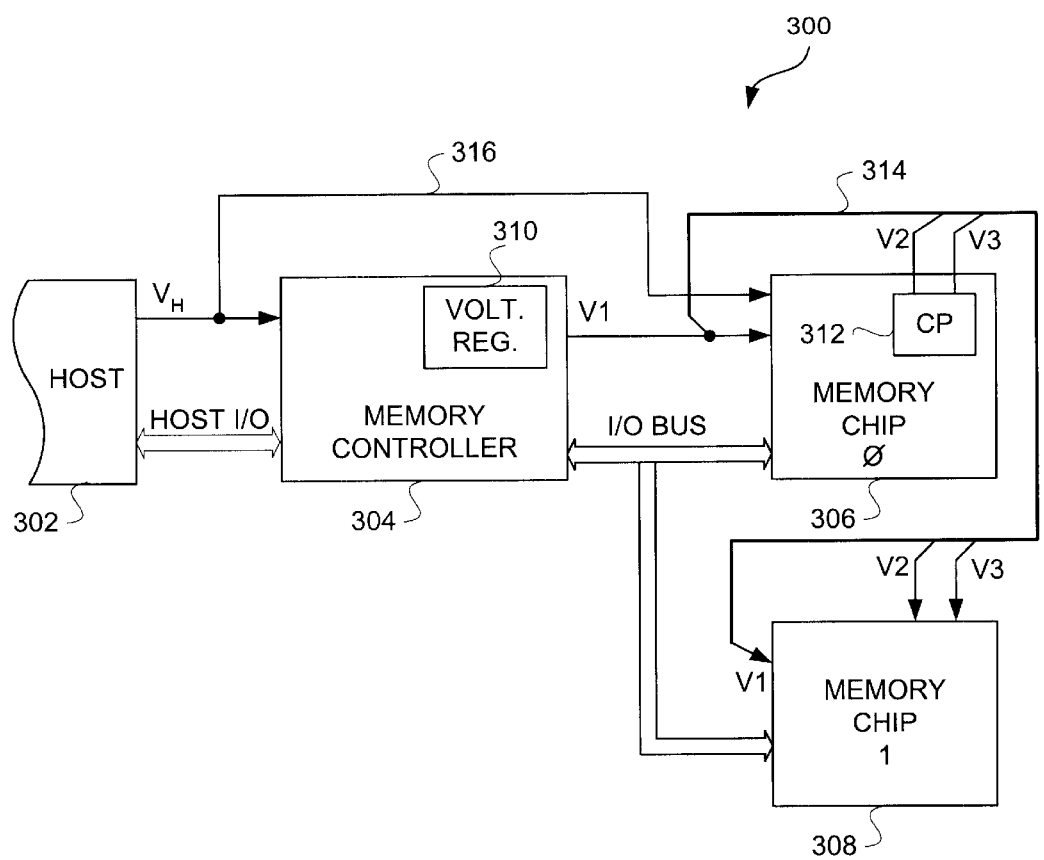
FIG. 3 is a block diagram of a memory system according to another embodiment of the invention.

FIG. 3 is a block diagram of a memory system 300 according to another embodiment of the invention. The memory system 300 couples to a host 302. The interface between the memory system 300 and host 302 includes a host voltage ($V_H$) and a host I/O bus.

The memory system 300 includes a memory controller 304 and memory blocks 306 and 308. Although the memory system 300 includes only two memory blocks, it should be understood that additional memory blocks can also be provided in the memory system 300. The memory controller 304 and memory blocks 306 and 308 communicate over an I/O bus. In addition, a voltage regulator 310 within the memory controller 304 produces a supply voltage V1. The supply voltage V1 produced by the voltage regulator 310 represents, for example, a regulated version of the host voltage $V_H$. The supply voltage V1 is supplied to the memory block 306.

The memory block 306 also includes charge pump circuitry 312. The charge pump circuitry 312 receives the supply voltage V1 from the memory controller 304 and generates at least one additional supply voltage. In this embodiment, it is assumed that the charge pump circuitry 312 produces a second supply voltage V2 and a third supply voltage V3. Accordingly, it should be noted that the charge pump circuitry 312 could generate more than two supply voltages or could generate a single supply voltage. Typically, the charge pump circuitry 312 includes a charge pump and/or a regulator.

The memory system 300 also includes a power bus 314. The power bus 314 receives the supply voltage V1 from the memory controller 304 (or the memory block 306) and also receives the supply voltages V2 and V3 from the memory block 306. The power bus 314 then transports these supply voltages to the other memory blocks, namely, the memory block 308. In particular, the memory block 306 and the memory block 308 can each include three contacts (e.g., terminals, pins or pads) to respectively couple to the supply voltages V1, V2 and V3. The power bus 314 respectively interconnects these three terminals of each of the memory blocks 306 and 308. Hence, the supply voltage V1 produced by the memory controller 304 is able to be coupled not only to the memory block 306 but also to the memory block 308 using the power bus 314. Likewise, the supply voltages V2 and V3 produced by the charge pump circuitry 312 are able to be not only internally used within the memory block 306 but also externally supplied through the power bus 314 to the memory block 308 (and possibly other blocks). Accordingly, the memory system 300 requires only that one of the memory blocks include charge pump circuitry to generate the additional supply voltage levels needed by the various memory blocks.

Further, the host voltage $V_H$ can also be supplied to the memory block 306. The charge pump circuitry 312 can then produce the second and third supply voltages V2 and V3 using the first supply voltage V1 and/or the host voltage $V_H$. The availability of the host voltage $V_H$ at the memory block 306 can enable the charge pump circuitry 312 to more efficiently produce the second and third supply voltages V2 and V3. For example, if the host voltage $V_H$ were 5.0 volts and the first supply voltage V1 were 3.0 volts, then producing a third supply voltage of 6.5 volts would be more efficient (i.e., less charge pumping required) from a 5.0 volts starting point as opposed to a 3.0 volts starting point. The host voltage $V_H$ can be directly coupled to the memory block 306 over a link 316. The link 316 can be implemented as a wire, trace or other electronic interconnection. Alternatively, the host voltage $V_H$ could be indirectly supplied to the memory block 306, through the memory controller 310.

Further, it should be noted that a dotted box illustrated within the memory block 308 represents an optional charge pump circuit 318. The optional charge pump circuit 318 can be provided within the memory block 308 (or other memory blocks within the memory system) as a secondary or back-up charge pump circuit. In one implementation, the optional charge pump circuit 318 can be used to produce one or more additional supply voltages for the memory block 308 that are not available from the power bus 314. In another implementation, the charge pump circuit 318 can be activated to produce the supply voltages V2 and V3 in the event that the charge pump circuitry 312 is inoperable and, thus, supply the supply voltages V2 and V3 to the memory block 306 via the power bus 314. In an embodiment that includes such optional charge pump circuits, the host voltage $V_H$ can also be coupled to the memory block 308 via the power bus 314 or a link 320.

Figure 4:
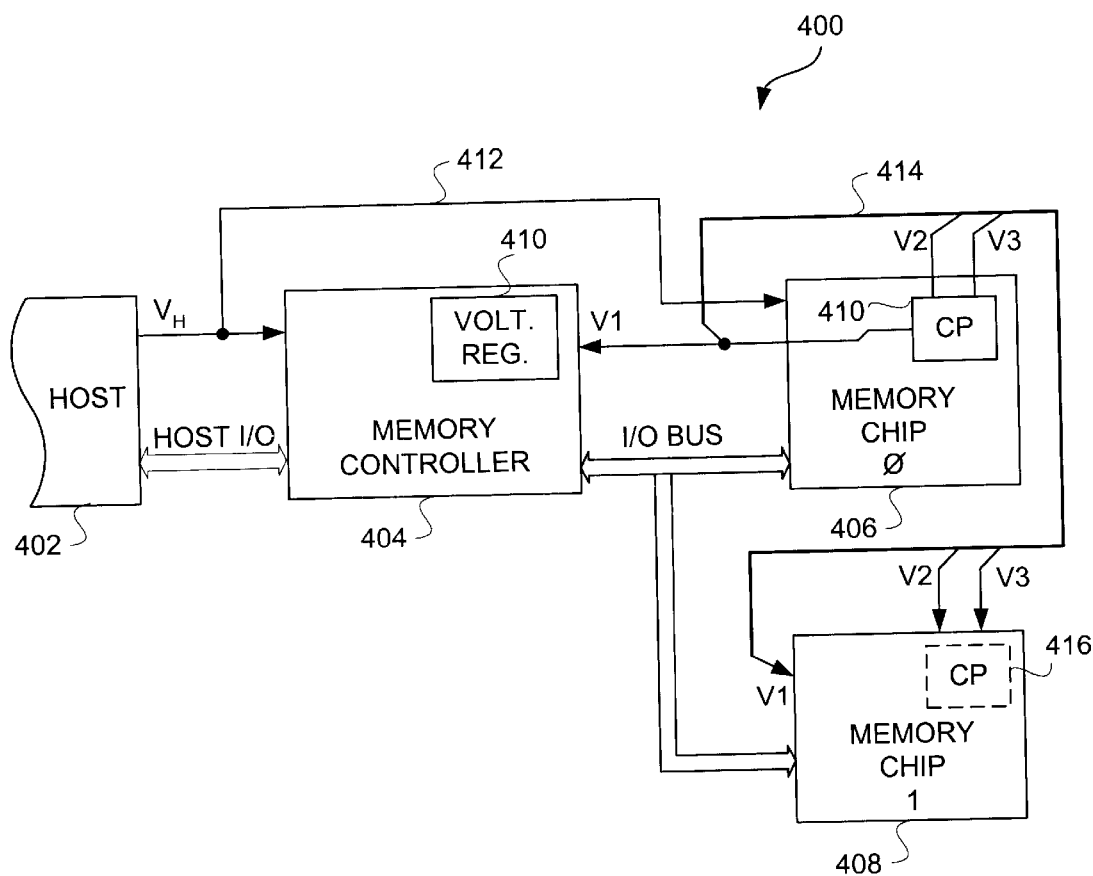
FIG. 4 is a block diagram of a memory system according to still another embodiment of the invention.

FIG. 4 is a block diagram of a memory system 400 according to still another embodiment of the invention. The memory system 400 couples to a host 402. The host 402 and the memory system 400 communicate over a host I/O bus. The host 402 also supplies a host voltage $V_H$ to the memory controller 404. The memory system 400 includes the memory controller 404 and memory blocks 406 and 408. In this embodiment, like the memory system 300 illustrated in FIG. 3, the memory block 406 includes charge pump circuitry 410. However, unlike the memory system 300, the memory controller 404 does not include a voltage regulator. In other words, the memory controller 404 is not producing any supply voltages that are utilized by the memory blocks 406 and 408. Instead, in this embodiment, the charge pump circuitry 410 provided in the memory block 406 is supplying all the supply voltages needed by the memory blocks 406 and 408. In particular, the charge pump circuitry 410 can produce a plurality of supply voltages, namely, supply voltages V1, V2 and V3. The charge pump circuitry 410 receives the host voltage $V_H$ provided by the host 402 over a link 412. The charge pump circuitry 410 uses the host voltage $V_H$ in producing the supply voltages V1, V2 and V3. The charge pump circuitry 410 can supply the supply voltage V1, not only internally to the memory block 406 but also externally to the memory controller 404, if desired by the memory controller. Still further, the supply voltages V1, V2 and V3 (in addition to being used internal to the memory block 406) are coupled to a power bus 414. The power bus 414 operates to couple the supply voltages V1, V2 and V3 between the memory blocks 406 and 408. Hence, the supply voltages V1, V2 and V3 are supplied to the memory block 408 via the power bus 414. In other words, the memory block 408 is not internally generating any of the supply voltage levels but instead receives the supply voltage levels over the power bus 414.

Further, it should be noted that a dotted box illustrated within the memory block 408 represents an optional charge pump circuit 416. The optional charge pump circuit 416 can be provided within the memory block 408 (or other memory blocks within the memory system) as a secondary or back-up charge pump circuit. In one implementation, the optional charge pump circuit 416 can be used to produce one or more additional supply voltages for the memory block 408 that are not available from the power bus 414. In another implementation, the charge pump circuit 416 can be activated to produce the supply voltages V1, V2 and V3 in the event that the charge pump circuitry 410 is inoperable and, thus, supply the supply voltages V1, V2 and V3 to the memory block 406 via the power bus 414. In an embodiment that includes such optional charge pump circuits, the host voltage $V_H$ can also be coupled to the memory block 408 via the power bus 414.

Figure 5:
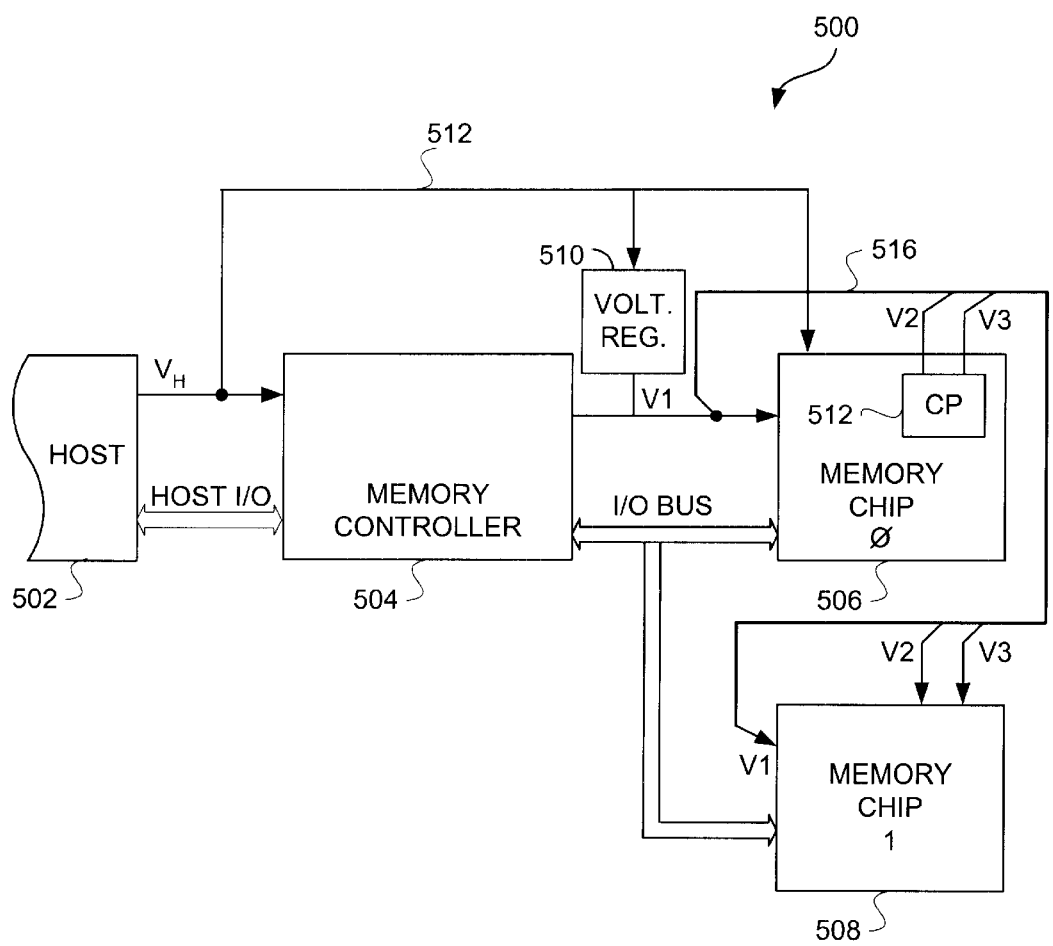
FIG. 5 is a block diagram of a memory system according to yet another embodiment of the invention.

FIG. 5 is a block diagram of a memory system 500 according to yet another embodiment of the invention. The memory system 500 couples to a host 502. The host 502 and the memory system 500 communicate over a host I/O bus. The host 502 also supplies a host voltage $V_H$ to the memory system 500.

The memory system 500 includes a memory controller 504 and memory blocks 506 and 508. The memory controller 504 and the memory blocks 506 and 508 communicate over an I/O bus. The memory system 500 also includes a voltage regulator 510. In this embodiment, the voltage regulator 510 represents a separate functional unit from the memory controller 504 or the memory blocks 506 and 508. Typically, the voltage regulator 510 is provided as a separate semiconductor die or chip within the memory system 500. The voltage regulator 510 receives the host voltage $V_H$ over a link 512. The link 512 can also couple the host voltage $V_H$ to the memory block 506. The voltage regulator 510 produces a first supply voltage V1. The voltage regulator 510 supplies the first supply voltage V1 to the memory controller 504 and the memory block 506.

In addition, the memory block 506 includes charge pump circuitry 514. The charge pump circuitry 514 operates to produce at least one additional supply voltage. In this embodiment, it is assumed that the charge pump circuitry 514 produces a second supply voltage V2 and a third supply voltage V3. The charge pump circuitry 514 receives the host voltage $V_H$ as well as the first supply voltage V1, and thus is able to produce the supply voltages V2 and V3 using either or both of those source voltages. By using the host voltage $V_H$, the charge pump circuitry 514 is often able to more efficiently produce either of the supply voltages V2 or V3 because less "charge pumping" is required.

The memory system 500 also includes a power bus 516. The power bus 516 couples the supply voltages V1, V2 and V3 to the memory block 508. The supply voltages V1, V2 and V3 are thus input to the memory block 508 via the power bus 516. In other words, the memory block 508 does not generate any of the supply voltages. Indeed, the memory block 508 typically does not include any charge pump circuitry. However, if desired, the memory block 508 could include a back-up charge pump circuit for use should the primary charge pump circuitry 514 fail.

In the embodiments of the invention illustrated in FIGS. 2–5, the memory systems included two memory blocks. However, it should be noted that the memory systems can more generally include two or more memory blocks. Typically, additional memory blocks would be added to the memory systems to increase their data storage capacity. These additional memory blocks would normally be configured and/or-operate as do the memory blocks 208, 308, 408 or 508. Also, in any of the embodiments of the invention discussed above, optional charge pump and/or regulator circuitry can be provided in one or more of the memory blocks. Such optional charge pump and/or regulator circuitry can serve as a backup or secondary function in case the primary charge pump and/or regulator circuitry becomes inoperable. Additionally or alternatively, the optional charge pump and/or regulator circuitry can operate to provide additional internal voltage generation within the memory blocks in cases where the necessary voltages needed by the memory blocks are not supplied to the memory blocks.

The invention is suitable for use with both single-level memories and multi-level memories. The memories or memory blocks are data storage devices that include data storage elements. The data storage elements can be based on semiconductor devices (e.g., floating-gate) or other types of devices. In multi-level memories, each data storage element stores two or more bits of data.

The invention can further pertain to an electronic system that includes a memory system as discussed above. Memory systems (i.e., memory cards) are commonly used to store digital data for use with various electronics products. The memory system is often removable from the electronic system so the stored digital data is portable. The memory systems according to the invention can have a relatively small form factor and be used to store digital data for electronics products such as cameras, hand-held or notebook computers, network cards, network appliances, set-top boxes, hand-held or other small audio players/recorders (e.g., MP3 devices), and medical monitors.

The advantages of the invention are numerous. Different embodiments or implementations may yield one or more of the following advantages. One advantage of the invention is that generation and distribution of supply voltages are made more cost effective. Another advantage of the invention is that noise from generation of different voltage levels does not hinder memory access performance. Still another advantage of the invention is that reliable, high performance memory systems can be obtained. Yet still another advantage of the invention is that memory systems can be implemented with low power consumption and more flexibility in controller design.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A memory system that receives an external supply voltage from a host, said memory system comprising:
    a plurality of memory blocks, each of said memory blocks including at least a plurality of data storage elements; and
    a memory controller operatively coupled to said memory blocks and operatively coupled to receive the external supply voltage when said memory system is operatively connected to the host, said memory controller including at least a voltage generation circuit operable to generate at least first and second supply voltages for use by each of said memory blocks, the first and second supply voltages being different than the external supply voltage.

2. A memory system as recited in claim 1, wherein said memory blocks do not include voltage generation circuitry to internally generate any supply voltages.

3. A memory system as recited in claim 1, wherein said memory system is a memory card.

4. A memory system as recited in claim 1, wherein said memory system is a removable data storage product.

5. A memory system as recited in claim 1, wherein the host is a computing device.

6. A memory system as recited in claim 1, wherein said memory system removably couples to the host.

7. A memory system as recited in claim 1, wherein said memory system is a memory card capable of removably coupling to the host, and wherein the host is a computing device,
    wherein said voltage generation circuit further generates a third supply voltage, and
    wherein said power bus further supplies the third supply voltage between said memory blocks.

8. A memory system as recited in claim 1, wherein the voltage generation circuit is a voltage regulator.

9. A memory system as recited in claim 1, wherein said memory system further comprises:
    a power bus coupled to each of said memory blocks, said power bus supplying at least the first and second supply voltages between said memory blocks.

10. A memory system as recited in claim 9, wherein said power bus supplies at least the first and second supply voltages to each of said memory blocks, and wherein said power bus does not supply the external supply voltage to any of said memory blocks.

11. A memory system as recited in claim 1, wherein said memory system is provided within a single package.

12. A memory system as recited in claim 11, wherein the single package is a memory card.

13. A memory system as recited in claim 1, wherein said data storage elements provide non-volatile data storage.

14. A memory system as recited in claim 13, wherein each of said data storage elements comprise at least one floating-gate storage device.

15. A memory system as recited in claim 13, wherein said data storage elements provide semiconductor-based data storage.

16. A memory system as recited in claim 15, wherein said data storage elements are EEPROM or FLASH.

17. A memory system that receives an external supply voltage from a host, said memory system comprising:
    a plurality of memory blocks, each of said memory blocks including at least a plurality of data storage elements, at least one of said memory blocks further including at least a first voltage generation circuit operable to produce at least one memory-generated supply voltage;
    a memory controller operatively coupled to said memory blocks and operatively coupled to receive the external supply voltage when said memory system is operatively connected to the host, said memory controller including at least a second voltage generation circuit operable to produce at least one controller-generated supply voltage; and
    a power bus coupled to each of said memory blocks, said power bus supplying the at least one memory-generated supply voltage between said memory blocks.

18. A memory system as recited in claim 17, wherein said power bus further supplies the at least one controller-generated supply voltage between said memory blocks.

19. A memory system as recited in claim 17, wherein said memory system further comprises:
    an Input/Output (I/O) bus operatively coupling between said memory controller and each of said memory blocks.

20. A memory system as recited in claim 17, wherein, when said memory system is operatively connected to the host, the external supply voltage is supplied to the at least one of said memory blocks that includes at least said first voltage generation circuit.

21. A memory system as recited in claim 20, wherein said first voltage generation circuit receives the external supply voltage when said memory system is operatively connected to the host, and the external supply voltage is used by said first voltage generation circuit to generate the at least one memory-generated supply voltage.

22. A memory system as recited in claim 17, wherein said memory system further comprises a link that couples said memory controller to the at least one of said memory blocks, the link carrying the at least one controller-generated supply voltage from said memory controller to the at least one of said memory blocks.

23. A memory system as recited in claim 17, wherein said first voltage generation circuit is a voltage regulation circuit, and wherein said second voltage generation circuit is a charge pump and regulation circuit.

24. A memory system as recited in claim 17, wherein said memory blocks other than the at least one of said memory blocks do not include voltage generation circuitry to internally generate any supply voltages.

25. A memory system as recited in claim 17, wherein said data storage elements provide non-volatile data storage.

26. A memory system as recited in claim 17, wherein said memory system is a memory card.

27. A memory system as recited in claim 26, wherein said memory system is provided within a single package.

28. A memory system as recited in claim 17, wherein said memory system is a removable data storage product.

29. A memory system as recited in claim 17, wherein the host is a computing device, and wherein said memory system removably couples to the host.

30. A memory system as recited in claim 17,
- wherein said first voltage generation circuit produces a plurality of memory-generated supply voltages, one of the memory-generated supply voltages being the at least one memory-generated supply voltage, and
- wherein said power bus supplies the plurality of memory-generated supply voltages between said memory blocks.

31. A memory system as recited in claim 17, wherein at least another of said memory blocks further includes at least a voltage generation circuit operable to produce the at least one memory-generated supply voltage.

32. A memory system that receives an external supply voltage from a host, said memory system comprising:
- a plurality of memory blocks, each of said memory blocks including at least a plurality of data storage elements, at least one of said memory blocks further including at least a first voltage generation circuit operable to produce at least one memory-generated supply voltage;
- a memory controller operatively coupled to access said memory blocks; and
- a power bus coupled to each of said memory blocks, said power bus supplying the at least one memory-generated supply voltage between said memory blocks.

33. A memory system as recited in claim 32, wherein, when said memory system is operatively connected to the host, the external supply voltage is supplied to the at least one of said memory blocks that includes at least said first voltage generation circuit.

34. A memory system as recited in claim 33, wherein said memory system further comprises:
- an Input/Output (I/O) bus operatively coupling between said memory controller and each of said memory blocks.

35. A memory system as recited in claim 32, wherein at least another of said memory blocks further includes at least a voltage generation circuit operable to produce the at least one memory-generated supply voltage.

36. A memory system as recited in claim 32, wherein said memory system is a memory card.

37. A memory system as recited in claim 32,
- wherein said voltage generation circuit produces a plurality of memory-generated supply voltages, one of the memory-generated supply voltages being the at least one memory-generated supply voltage, and
- wherein said power bus supplies the plurality of memory-generated supply voltages between said memory blocks.

38. A memory system as recited in claim 37, wherein at least one of the plurality of memory-generated supply voltages is supplied to said memory controller.

39. A memory system as recited in claim 38, wherein said memory controller does not include any voltage generation circuitry for producing any supply voltages for use by any of said memory blocks.

40. A memory system as recited in claim 32,
- wherein said memory system further comprises:
    - a voltage regulator separate from said memory controller and said memory blocks, said voltage regulator producing a regulator-generated supply voltage that is supplied to said power bus, and
- wherein the regulator-generated supply voltage is supplied between said memory blocks via said power bus.

41. A data storage device that removably couples to a host unit, said data storage device comprising:
- a memory controller;
- a plurality of memory blocks operatively connected to said memory controller, each of said memory blocks including at least data storage elements; and
- a power bus operatively supplying different level supply voltages between each of said memory blocks, the different level supply voltages being centrally generated by one of said memory blocks.

42. An electronic system, comprising:
- a data acquisition device; and
- a data storage device removably coupled to said data acquisition unit, said data storage device storing data acquired by said data acquisition device, and said data storage device including at least
    - a memory controller;
    - a plurality of memory blocks operatively connected to said memory controller, each of said memory blocks including at least data storage elements; and
    - a power bus operatively supplying different level supply voltages between each of said memory blocks, the different level supply voltages being centrally generated by one of said memory blocks.

43. An electronic system as recited in claim 42, wherein said data acquisition device is one of a camera, a network card or appliance, a hand-held or notebook computer, a set-top box, a hand-held or other small audio player/recorder, and a medical monitor.

\* \* \* \* \*